United States Patent
Chen et al.

(10) Patent No.: US 6,849,948 B2
(45) Date of Patent: Feb. 1, 2005

(54) CONTACT STRUCTURE AND MANUFACTURING METHOD THEREOF

(75) Inventors: Tung-Yu Chen, Taipei (TW); Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/605,276

(22) Filed: Sep. 19, 2003

(65) Prior Publication Data

US 2004/0173900 A1 Sep. 9, 2004

(30) Foreign Application Priority Data

Mar. 5, 2003 (TW) .......................... 92104616 A

(51) Int. Cl.$^7$ .......................... H01L 23/48; H01L 23/52; H01L 29/40
(52) U.S. Cl. .................. 257/758; 257/765; 257/773; 257/774
(58) Field of Search .................... 257/758, 765, 257/773–774

(56) References Cited

U.S. PATENT DOCUMENTS

2003/0178571 A1 * 9/2003 Nayfeh et al. .............. 250/372

* cited by examiner

Primary Examiner—Thien F Tran
(74) Attorney, Agent, or Firm—Jiang Chyun IP Office

(57) ABSTRACT

A contact structure and manufacturing method thereof is provided. A substrate having a first conductive layer and a dielectric layer thereon is provided. The dielectric layer has a contact opening that exposes a portion of the first conductive layer. A conductive nano-particle layer is formed on the exposed surface of the first conductive layer. Thereafter, a second conductive layer is formed inside the contact opening to cover the conductive nano-particle layer and form a contact structure. The conductive nano-particle layer at the bottom of the contact prevents the second conductive layer from peeling off and costs much less to produce.

6 Claims, 6 Drawing Sheets

CONTACT STRUCTURE AND MANUFACTURING METHOD THEREOF

CROSS REFERENCE TO RELATED APPLICATIONS

This application claims the priority benefit of Taiwan application serial no. 92104616, filed on Mar. 5, 2003.

BACKGROUND OF INVENTION

1. Field of Invention

The present invention relates to a semiconductor device structure and manufacturing method thereof. More particularly, the present invention relates to the contact structure of a semiconductor device and manufacturing method thereof.

2. Description of Related Art

In the fabrication of a liquid crystal display, the conductive layers above and below an insulating layer are electrically connected through a contact in the insulating layer fabricated by performing a photolithographic and an etching process. For example, the pixel electrode and the drain terminal of a thin film transistor in a pixel structure are electrically connected together by performing a photolithographic and etching process to form a contact opening in the dielectric layer that exposes the underlying drain terminal. Thereafter, the pixel electrode is deposited over the dielectric layer and electrically connects to the drain terminal through the contact opening.

In the process of fabricating the thin film transistor, the first metallic layer (comprising circuit elements such as the gates and the scanning lines) and the second metallic layer (comprising the circuit elements such as the source/drain terminals and the data lines) are fabricated using aluminum or aluminum alloy. Aluminum is often selected because it has the preferred conductive properties. On the other hand, the pixel electrode is fabricated using indium-tin oxide. Aside from having an electrical connection with the drain terminal through a contact, the pixel electrode also connects electrically with the upper electrode of a pixel storage capacitor. However, if the first metallic layer and the second metallic layer are made from aluminum, the indium-tin film over the aluminum layer may initiate a galvanic reaction under the influence of a chemical developer. As a result, the indium-tin oxide film may gradually peel off from the first metallic layer or the second metallic layer.

To prevent the indium-tin oxide film from peeling off the first or the second metallic layer, a molybdenum or titanium layer is formed over the exposed first or second metallic layer within the contact opening to serve as a buffer layer. In other words, current flows from the indium-tin oxide electrode to the first or the second metallic layer via the molybdenum or titanium layer. Although the method is effective in stopping the indium-tin oxide film from peeling, molybdenum or titanium is expensive metal to work with. Moreover, sputtering molybdenum or titanium material over a contact opening to form the required buffer layer is a rather inefficient process. Hence, the conventional method often leads to a waste of material and an increase in production cost.

SUMMARY OF INVENTION

Accordingly, one object of the present invention is to provide a contact structure and manufacturing method thereof capable of preventing an indium-tin oxide film peeling off from an underlying metallic layer within a contact due to a galvanic reaction.

A second object of this invention is to provide a contact structure and manufacturing method thereof capable of bringing down the cost of producing a conventional set up for preventing the peeling of an indium-tin oxide film from an underlying metallic layer within a contact.

To achieve these and other advantages and in accordance with the purpose of the invention, as embodied and broadly described herein, the invention provides a method of manufacturing a contact. First a substrate having a first conductive layer and a dielectric layer thereon is provided. The dielectric layer has a contact opening that exposes the first conductive layer. Thereafter, a conductive nano-particle layer is formed over the exposed first conductive layer. The conductive nano-particle layer is a metallic nano-particle layer or a silicon nano-particle layer, for example. A low temperature annealing operation is performed to consolidate the conductive nano-particle layer into a nano-particle film such as a metallic nano-particle film or a metal silicide film. Next, a second conductive layer is formed inside the contact opening covering the nano-particle film to form a contact structure.

In one embodiment of this invention, the conductive nano-particle layer is formed in a charge adsorption method. First, a substrate with a contact opening thereon is immersed in a pool of special solution. The solution comprises a solvent and conductive nano-particles disperse throughout the solvent. Thereafter, a positive direct current or a negative direct current is passed into the solution so that the conductive nano-particles are adsorbed towards the surface of the exposed first conductive layer to form the conductive nano-particle layer.

In another embodiment of this invention, the conductive nano-particle layer is formed in a charge deposition method. First, a patterned photoresist layer is formed over the dielectric layer on a substrate to expose the contact opening. The entire structure is next immersed in an electroplating solution. The electroplating solution comprises a solvent and conductive nano-particles are dispersed throughout the solvent. Thereafter, using the substrate as an anode and a metallic electrode (for example, a platinum electrode) as a cathode, an electroplating process is carried out so that the conductive nano-particles are adsorbed towards the surface of the first conductive layer to form a conductive nano-particle layer.

In yet another embodiment of this invention, the conductive nano-particle layer is formed in a self-assembly method. First, a substrate with a contact opening thereon is immersed in a solution containing self-assembling molecules (for example, a molecule having a disulfhydryl functional group) so that the self-assembling molecules are adsorbed towards the surface of the exposed first conductive layer. Thereafter, the substrate structure is transferred to another solution that comprises a solvent and conductive nano-particles dispersed throughout the solvent. The self-assembling molecules on the first conductive layer adsorb and accumulate conductive nano-particles to form a conductive nano-particle layer.

This invention also provides a semiconductor device structure comprising a conductive layer, a dielectric layer, a contact and a conductive nano-particle layer. The conductive layer is formed on a substrate and the dielectric layer is formed on the conductive layer. The contact is formed in the dielectric layer and electrically connected to the conductive layer. The conductive nano-particle layer is formed between the conductive layer and the contact. Hence, the conductive layer is electrically connected to the contact through the conductive nano-particle layer. In this invention, the conductive nano-particle layer is preferably a low-temperature-annealed consolidated nano-particle film.

In this invention, the conductive nano-particle layer at the bottom section of the contact opening has special cohesive properties that prevent a subsequently formed conductive layer in the contact opening from peeling away.

In this invention, the conductive nano-particle layer is formed using the charge adsorption, the charge deposition or the self-assembly method. The conductive nano-particle layer serves as a buffer layer similar to the sputtered molybdenum layer or titanium layer in a conventional method. However, the nano-particle layer is less expensive to manufacture.

Furthermore, the conductive nano-particle layer is annealed at a low temperature to form the conductive nano-particle film. Hence, the method of this invention has the added advantage of bringing down the overall thermal budget of the device.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
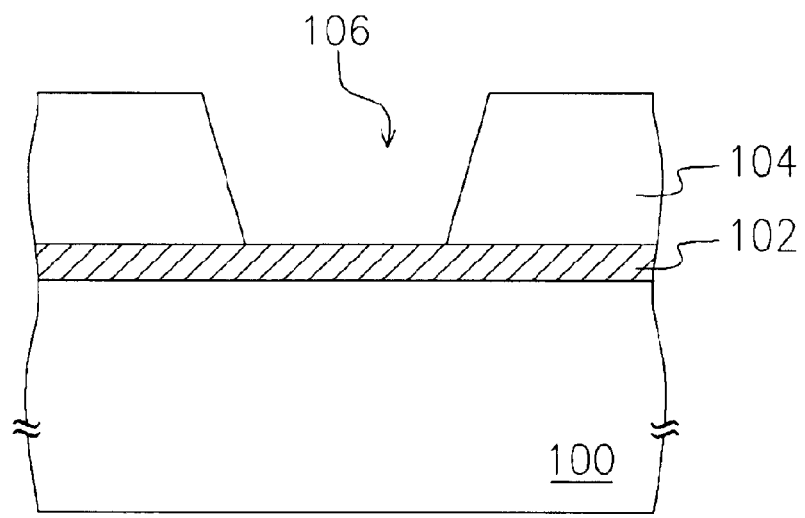
FIGS. 1A to 1D are schematic cross-sectional views showing the steps for fabricating a contact according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

In this invention, a conductive nano-particle layer is formed at the bottom of a contact between an indium-tin oxide film and an underlying metallic layer within the contact opening to prevent the indium-tin oxide film from peeling off due to a galvanic reaction. In the following, a few preferred embodiments are presented to show the steps for producing the conductive nano-particle layer and the contact.

FIGS. 1A to 1D are schematic cross-sectional views showing the steps for fabricating a contact according to a first preferred embodiment of this invention. As shown in FIG. 1A, a substrate 100 having a conductive layer 102 and a dielectric layer 104 thereon is provided. The dielectric layer 104 has a contact opening 106 that exposes the conductive layer 102. If this invention is applied to fabricate the thin film transistors with a liquid crystal display, the substrate 100 is a glass substrate. The conductive layer 102 is the first metallic layer (comprising patterned gates, scan lines, common lines and distributing terminals) or the second metallic layer (comprising patterned source/drain terminals, data lines, and the upper electrode of pixel storage capacitor). The dielectric layer 104 is the gate dielectric layer, the passivation layer or the composite layer of the gate dielectric layer and the passivation layer. The contact opening 106 is the contact opening for connecting the pixel electrode with the drain terminal of a transistor or the contact opening for connecting the pixel electrode with the upper electrode of the pixel storage capacitor.

Figure 1B:
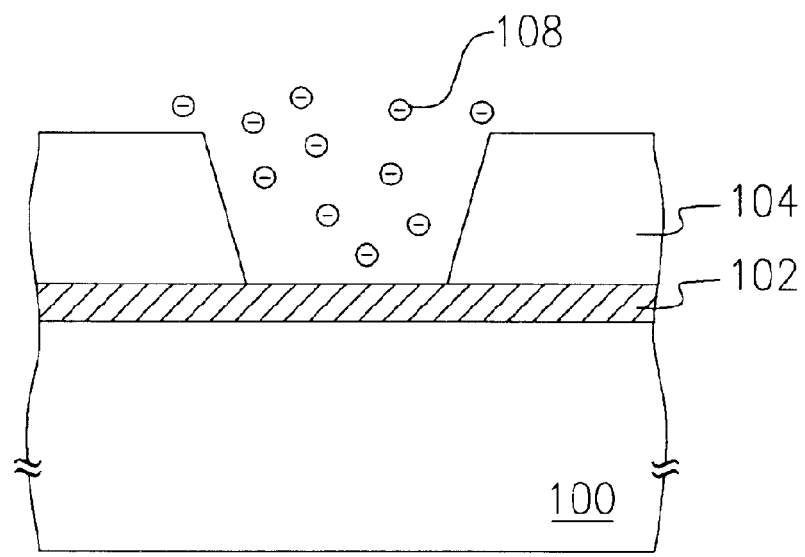

A charge adsorption method is used to form a conductive nano-particle layer at the bottom of the contact opening 106. As shown in FIG. 1B, the substrate structure 100 is immersed in a solution. The solution comprises a solvent and conductive nano-particles 108 dispersed throughout the solvent. The solvent can be water, polarized organic solvent or non-polarized organic solvent, for example. The conductive nano-particles 108 are metallic nano-particles or silicon nano-particles, for example. The metallic nano-particles 108 are particles fabricated using a metallic material including, for example, gold, silver, copper, titanium or molybdenum. Each conductive nano-particle has a size smaller than 100 nm, for example. Furthermore, to facilitate the spreading of the conductive nano-particles 108 within the solvent, some surfactant may be added to the solution. Suitable surfactant includes an organic compound with a long carbon backbone (C>5) or an organic compound with a hydrophilic end and a hydrophobic end (for example, $C_{16}H_{35}COOH$).

Figure 1C:
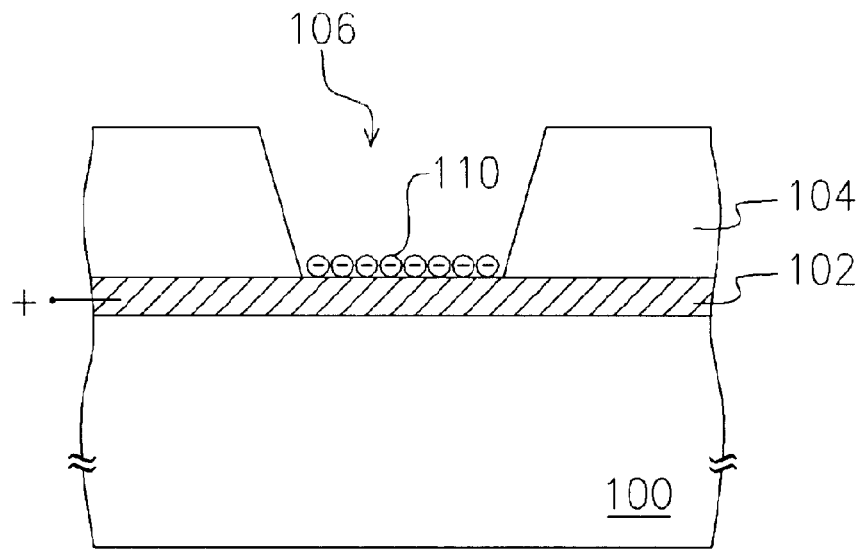

As shown in FIG. 1C, the surface of the conductive nano-particles 108 is electrically charged. When a positive direct current or a negative direct current (for example, a voltage between 20V to 20V) is applied to the conductive layer 102, the conductive nano-particles 108 will be physically adsorbed to the surface of the exposed conductive layer 102 and form a conductive nano-particle layer 110.

Figure 1D:
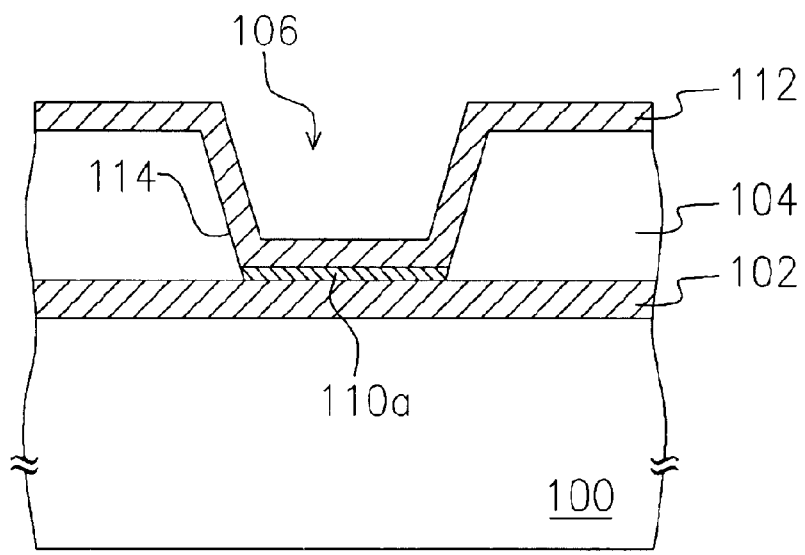

As shown in FIG. 1D, the conductive nano-particle layer 110 is annealed to consolidate the nano-particles into a nano-particle film 110a. The annealing operation is carried out at a temperature between 50° C. to 300° C. Thereafter, another conductive layer 112 is formed inside the contact opening 106 to form a contact 114. The conductive layer 112 is electrically connected to the conductive layer 102 through the nano-particle film 110a. If this invention is applied to fabricate the thin film transistors inside a liquid crystal display, the conductive layer 112 is a transparent indium-tin oxide electrode.

Figure 2A:
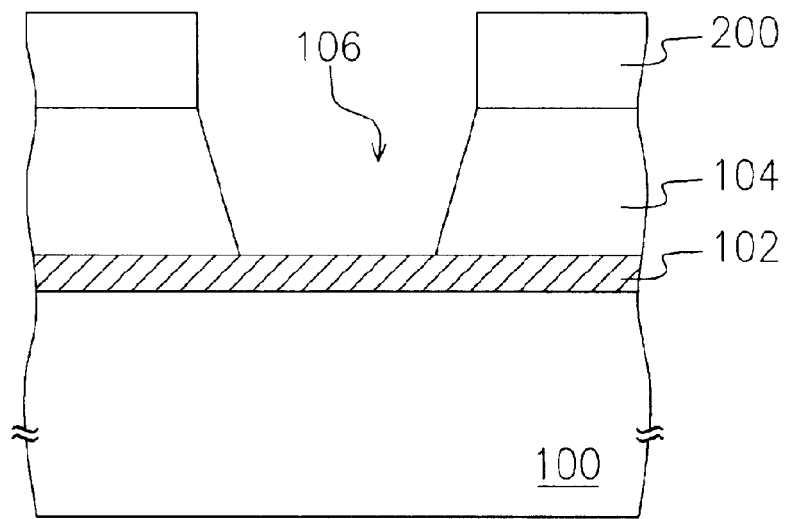
FIGS. 2A to 2D are schematic cross-sectional views showing the steps for fabricating a contact according to a second preferred embodiment of this invention.

In a second embodiment of this invention, a charge deposition method is used to fabricate the nano-particle film. FIGS. 2A to 2D are schematic cross-sectional views showing the steps for fabricating a contact according to a second preferred embodiment of this invention. As shown in FIG. 2A, a substrate 100 having a conductive layer 102 and a dielectric layer 104 thereon is provided. The dielectric layer 104 has a contact opening 106 that exposes the conductive layer 102.

Figure 2B:
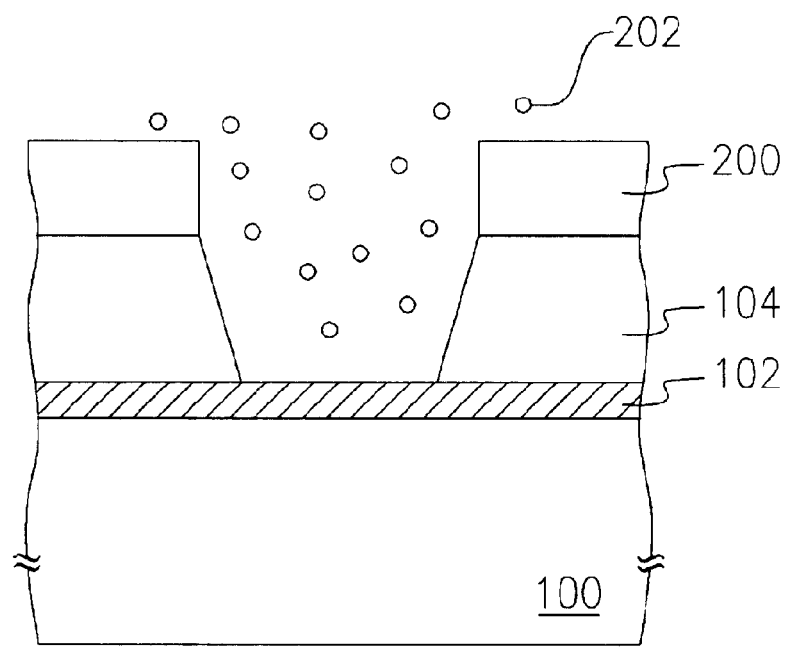

As shown in FIG. 2B, the substrate structure 100 is immersed in an electroplating solution. The electroplating solution comprises a solvent and conductive nano-particles 202 dispersed throughout the solvent. The solvent can be water, polarized organic solvent or nonpolarized organic solvent, for example. The conductive nano-particles 202 are metallic nano-particles fabricated using a metallic material including, for example, gold, silver, copper, titanium or molybdenum. Each conductive nano-particle 202 has a size smaller than 100 nm, for example. Furthermore, to facilitate the spreading of the conductive nano-particles 202 within the solvent, some surfactant may be added to the solution. Suitable surfactant includes an organic compound with a long carbon backbone (C>5) or an organic compound with a hydrophilic end and a hydrophobic end (for example, $C_{16}H_{35}COOH$).

Figure 2C:
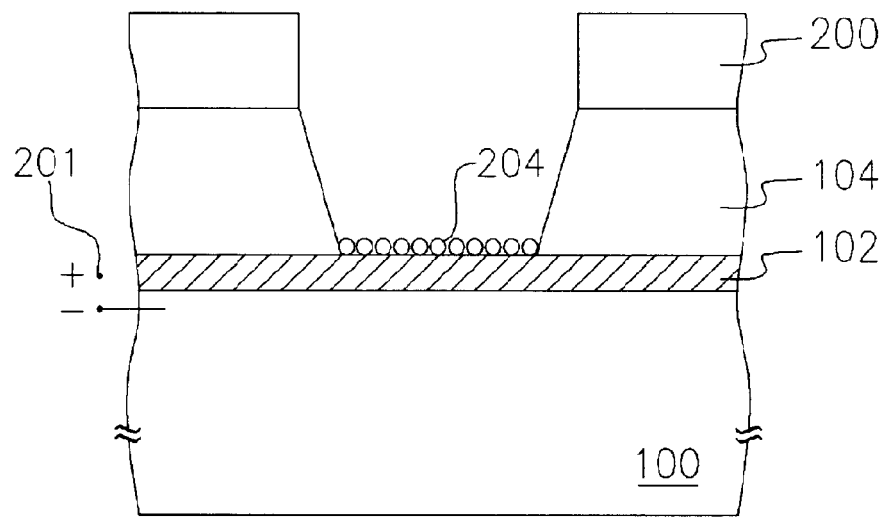

As shown in FIG. 2C, using the substrate 100 as an anode and a metallic electrode 201 (such as a platinum electrode) as a cathode, an electroplating process is carried out. In the electroplating process, the conductive nano-particles 202 are physically adsorbed to the surface of the conductive layer 102 to form a conductive non-particle layer 204.

Figure 2D:
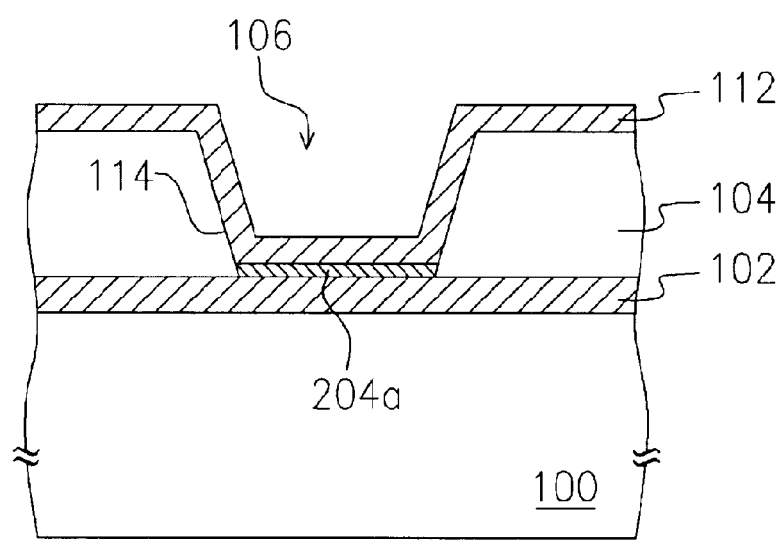

As shown in FIG. 2D, the conductive nano-particle layer 204 is annealed to consolidate the nano-particles into a nano-particle film 204a. The annealing operation is carried out at a temperature between 50° C. to 300° C. Thereafter, another conductive layer 112 is formed inside the contact opening 106 to form a contact 114. The conductive layer 112 is electrically connected to the conductive layer 102 through the nano-particle film 204a.

Figure 3A:
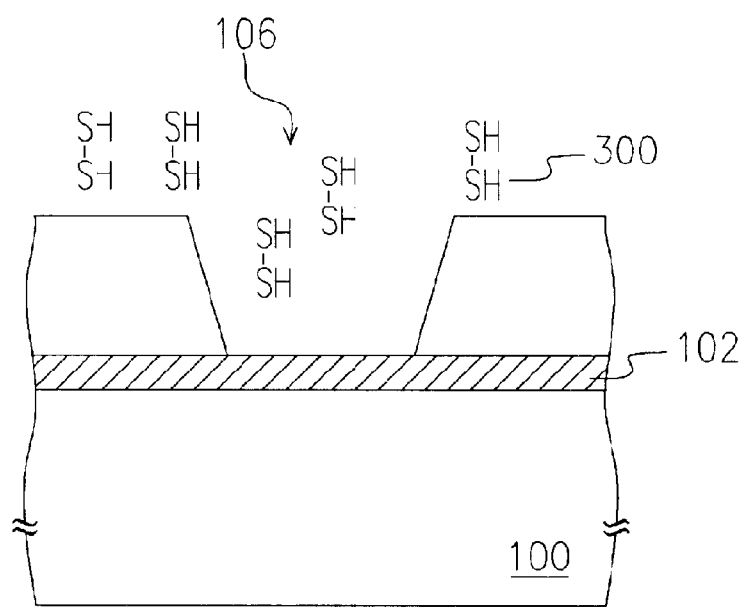
FIGS. 3A to 3D are schematic cross-sectional views showing the steps for fabricating a contact according to a third preferred embodiment of this invention.

In yet another embodiment of this invention, the nano-particle film is formed in a self-assembly process. FIGS. 3A to 3D are schematic cross-sectional views showing the steps for fabricating a contact according to a third preferred embodiment of this invention. As shown in FIG. 3A, a substrate 100 having a conductive layer 102 and a dielectric layer 104 thereon is provided. The dielectric layer 104 has a contact opening 106 that exposes the conductive layer 102. The substrate structure 100 is immersed in a solution containing self-assembly molecules 300. The self-assembly molecules 300 are, for example, molecules having a disulfhydrl functional group.

Figure 3B:
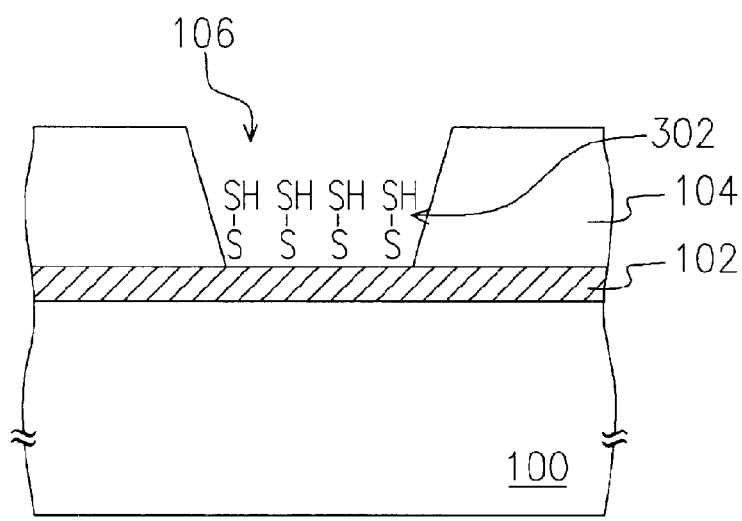

As shown in FIG. 3B, the self-assembly molecules 300 are adsorbed to the surface of the conductive layer 102. If the self-assembly molecules 300 have a disulfhydrl function group, the molecules 300 will dehydrate on the surface of the conductive layer 102 and then chemically bond with the conductive layer 102 to form a sulfhydryl radical surface 302.

Figure 3C:
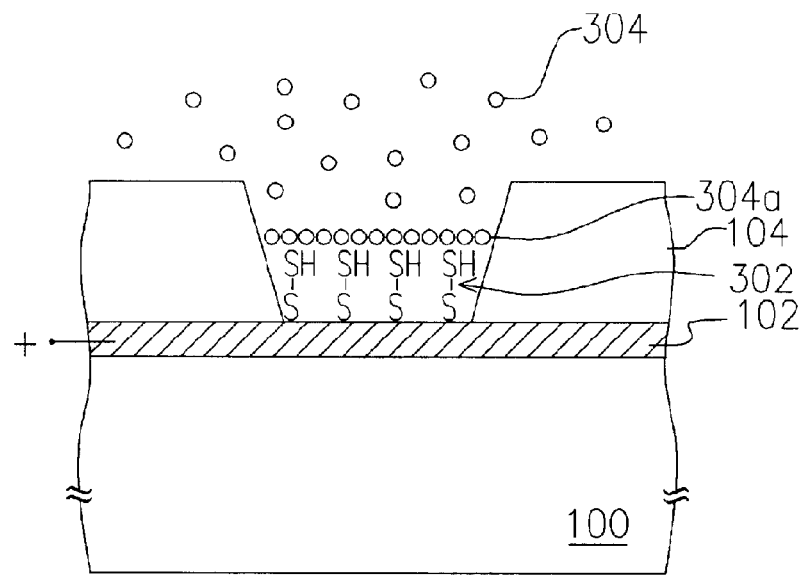

As shown in FIG. 3C, the substrate structure 100 is immersed in another solution. The solution comprises a solvent and conductive nano-particles 304 dispersed throughout the solvent. The solvent can be water, polarized organic solvent or non-polarized organic solvent, for example. The conductive nano-particles 304 are metallic nano-particles or silicon nano-particles. The metallic nano-particles are fabricated using a metallic material including, for example, gold, silver, copper, titanium or molybdenum. Each conductive nano-particle 304 has a size smaller than 100 nm, for example. Furthermore, to facilitate the spreading of the conductive nano-particles 304 within the solvent, some surfactant may be added to the solution. Suitable surfactant includes an organic compound with a long carbon backbone (C>5) or an organic compound with a hydrophilic end and a hydrophobic end (for example, $C_{16}H_{35}COOH$). The conductive nano-particles 304 in the solution are adsorbed by the sulfhydryl radical 302 on the conductive layer 102 to form a conductive nano-particles layer 304a.

Figure 3D:
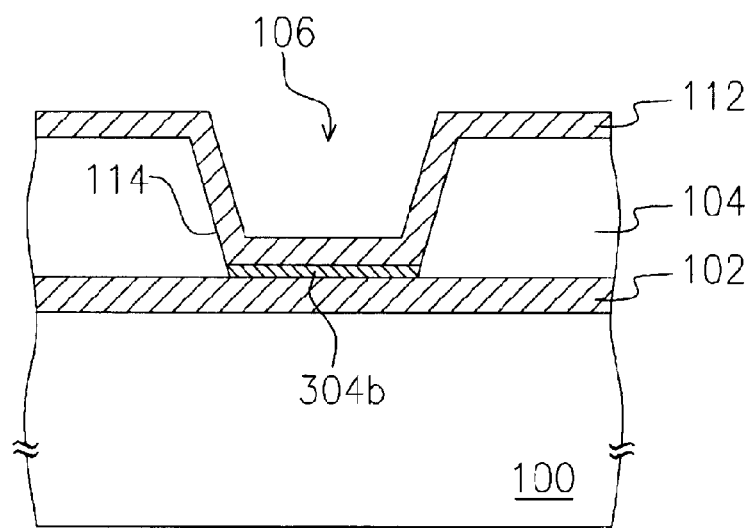

As shown in FIG. 3D, the conductive nano-particle layer 304a is annealed to consolidate the nano-particles into a nano-particle film 304b. The annealing operation is carried out at a temperature between 50° C. to 300° C. Thereafter, another conductive layer 112 is formed inside the contact opening 106 to form a contact 114. The conductive layer 112 is electrically connected to the conductive layer 102 through the nano-particle film 304b.

In this invention, the conductive nano-particle films 110a, 204a and 304b at the bottom of the contact opening 106 are formed using the charge adsorption, the charge deposition or the self-assembly method. The nano-particle film between the indium-tin oxide film 112 and the underlying conductive layer 102 within the contact opening 106 prevents the indium-tin oxide film 112 from peeling away from the conductive layer 102 due to a galvanic reaction.

This invention also provides a semiconductor device structure comprising a conductive layer 102, a dielectric layer 104, a contact 108 and a conductive nano-particle layer 110 or 204 or 304a. The conductive layer 102 is formed over the substrate 100 and the dielectric layer is formed over the conductive layer 102. The contact 108 is formed in the dielectric layer 104. Furthermore, the contact 108 and the conductive layer 102 are electrically connected together. The conductive nano-particle layer 110 or 204 or 304a is formed between the conductive layer 102 and the contact 108. The conductive nano-particle layer 110 or 204 or 304a is a metallic nano-particle layer or a silicon nano-particle layer. Preferably, the nano-particles in the conductive nano-particle layer 110 or 204 or 304a are further consolidated to form a nano-particle film 110a or 204a or 304b, for example, a metallic nano-particle film or a silicon nano-particle film.

In summary, major advantages of this invention include: 1. The conductive nano-particle layer formed at the bottom of a contact opening is able to prevent a subsequently formed conductive layer inside the contact opening from peeling off due to a galvanic reaction. 2. The conductive nano-particle layer is formed using the charge adsorption, the charge deposition or the self-assembly method. The conductive nano-particle layer serves as a buffer layer similar to the sputtered molybdenum layer or titanium layer in a conventional method. However, the nano-particle layer is less expensive to manufacture. 3. The conductive nano-particle layer is annealed at a low temperature to form the conductive nano-particle film. Hence, overall thermal budget of the device is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device structure, comprising:
   a conductive layer formed on a substrate;
   a dielectric layer formed on the conductive layer;
   a contact formed in the dielectric layer, wherein the contact and the conductive layer are electrically connected; and
   a conductive nano-particle layer formed between the conductive layer and the contact.

2. The semiconductor device structure of claim 1, wherein the conductive nano-particle layer comprises a metallic nano-particle layer.

3. The semiconductor device structure of claim 1, wherein the conductive nano-particle layer comprises a silicon nano-particle layer.

4. The semiconductor device structure of claim 1, wherein conductive nano-particles in the conductive nano-particle layer have an average size smaller than 100 nanometers.

5. The semiconductor device structure of claim 1, wherein the conductive nano-particle layer comprises a nano-particle consolidated nano-particle film.

6. The semiconductor device structure of claim 1, wherein material forming the conductive layer comprises aluminum.

* * * * *